(12) United States Patent
Kim et al.

(10) Patent No.: US 7,771,213 B2
(45) Date of Patent: Aug. 10, 2010

(54) SOLDERABLE ELECTRIC CONTACT TERMINAL

(75) Inventors: Sun-Ki Kim, Gunpo (KR); Seung-Jin Lee, Gunpo (KR)

(73) Assignee: Joinset Co., Ltd., Danwon-gu, Ansan-si, Kyeonggi-do (KR)

( * ) Notice: Subject to any disclaimer, the term of this patent is extended or adjusted under 35 U.S.C. 154(b) by 0 days.

(21) Appl. No.: 12/308,243

(22) PCT Filed: Feb. 22, 2007

(86) PCT No.: PCT/KR2007/000916

§ 371 (c)(1),
(2), (4) Date: Dec. 10, 2008

(87) PCT Pub. No.: WO2008/004741

PCT Pub. Date: Jan. 10, 2008

(65) Prior Publication Data

US 2009/0209121 A1    Aug. 20, 2009

(30) Foreign Application Priority Data

Jul. 3, 2006    (KR) .................. 20-2006-0017982 U

(51) Int. Cl.
*H01R 12/00* (2006.01)
*H05K 1/00* (2006.01)

(52) U.S. Cl. .................. 439/83; 439/927
(58) Field of Classification Search .................. 439/83, 439/88, 927; 174/356–358
See application file for complete search history.

(56) References Cited

U.S. PATENT DOCUMENTS 6,653,556 B2 * 11/2003 Kim .................. 174/358
7,402,761 B2 * 7/2008 Kim .................. 174/357

FOREIGN PATENT DOCUMENTS

| GB | 2 071 914 A | * | 9/1981 |
| JP | 03-101022 A | * | 4/1991 |
| KR | 200390490 | | 7/2005 |
| WO | WO 2005/053328 | * | 6/2005 |

* cited by examiner

*Primary Examiner*—Javaid Nasri
(74) *Attorney, Agent, or Firm*—Locke Lord Bissell & Liddell, LLP; Alan B. Clement; Peter J. Fallon

(57) ABSTRACT

A solderable electric contact terminal includes; an insulating foam rubber having a predetermined volume; an insulating non-foam rubber coating layer adhered to the insulating foam rubber such that the insulating non-foam rubber encloses the insulating foam rubber; and a heat resistant polymer film having inner surface adhered to the insulating non-foam rubber coating layer such that the heat resistant polymer film encloses the insulating non-foam rubber coating layer, and outer surface on which a metal layer is integrally formed.

8 Claims, 3 Drawing Sheets

SOLDERABLE ELECTRIC CONTACT TERMINAL

TECHNICAL FIELD

The present invention relates to an electric contact terminal, and more particularly, to a solderable elastic electric contact terminal having inner surface fixed to a printed circuit board (PCB) and outer surface elastically connected to an object, such that the object is electrically and mechanically connected to the printed circuit board (PCB).

BACKGROUND ART

Generally, solderable elastic electric contact terminals must have high electrical conductivity and high elastic resilience and must be tolerant to high soldering temperature. To this end, solderable electric contact terminals are formed of a metal. Specifically, beryllium copper is widely used for the electric contact terminals because it has high elastic resilience and high electrical conductivity. Specifically, a beryllium copper sheet having a thickness of less than 0.3 mm and a predetermined width is punched into a predetermined shape using a press die and then the punched beryllium copper sheet is heat-treated to form the electric contact terminal having an improved elastic resilience.

However, because of metal characteristic or structure, the electric contact terminals formed of the metal sheet only cannot provide high elasticity at less than a predetermined thickness. To increase the elasticity, the metal sheet must be bent in a predetermined shape. Because the thickness of the electric contact terminal is mostly determined by the bent thickness, the electric contact terminal cannot provide high elasticity at less than a predetermined thickness.

Especially, it is difficult to form a small-sized product having a thickness of less than 2 mm.

Because one press die can form products having an identical shape, additional press dies are needed to form products having different shapes.

In case where the metal sheet is applied to an indium tin oxide (ITO)-coated glass substrate, it may scratch the ITO coating.

Another related art is disclosed in Korean Utility Model Registration No. 2005-0012242, filed by the present applicant. However, a conductive elastic rubber coating layer has an electrical conductivity lower than that of metal. Therefore, an expensive metal powder such as silver (Ag) is used for increasing the electrical conductivity. The use of such an expensive metal powder, however, increases hardness and manufacturing cost. In addition, when the electric contact terminal is formed of the elastic rubber only, the it is difficult to provide an accurate dimension. Furthermore, an additional metal foil must be provided for soldering.

DISCLOSURE

Technical Problem

An object of the present invention is to provide a solderable elastic electric contact terminal that has good elastic resilience at less than a predetermined thickness.

Another object of the present invention is to provide a solderable elastic electric contact terminal that is cheap but has good electrical conductivity.

A further object of the present invention is to provide a solderable elastic electric contact terminal that can prevent a scratching on an ITO-coated glass substrate and provide an accurate dimension.

A further object of the present invention is to provide a solderable elastic electric contact terminal in which a surface contacting an object is flat so that a reflow process for surface mounting is possible.

A further object of the present invention is to provide a solderable elastic electric contact terminal in which a heat tolerant polymer film formed in a height direction is not creased when it is pressed by an object.

Technical Solution

The above and other objects, features and advantages of the present invention will become more apparent from the following detailed description.

A solderable electric contact terminal includes; an insulating foam rubber having a predetermined volume; an insulating non-foam rubber coating layer adhered to the insulating foam rubber such that the insulating non-foam rubber encloses the insulating foam rubber; and a heat resistant polymer film having inner surface adhered to the insulating non-foam rubber coating layer such that the heat resistant polymer film encloses the insulating non-foam rubber coating layer, and outer surface on which a metal layer is integrally formed.

Preferably, inner surface of the electric contact terminal contacting an object is flat so that both sides of a heat resistant polymer film is not separated or overlapped, thereby picking up the terminal under vacuum during a surface mounting process.

According to the present invention, it is preferable that the insulating foam rubber is formed of a silicon rubber and has a hardness of Shore A 15-50, a thickness of 0.6-15 mm, and a width of 3-20 mm.

According to the present invention, it is preferable that the insulating non-foam rubber is formed of a silicon rubber having a thickness of 0.03-0.5 mm and a hardness of Shore-A 15-50.

According to the present invention, the insulating non-foam rubber coating layer may be formed by vulcanizing a liquid silicon rubber. The vulcanized silicon rubber adheres the insulating foam rubber to the heat resistant polymer film. More preferably, the liquid silicon rubber is one-part adhesive and is vulcanized by moisture.

According to the present invention, the heat resistant polymer film may be a single-sided flexible printed circuit board (FPCB). The heat resistant polymer film may be formed of a polyimide film having a thickness of 0.01-0.04 mm. The metal layer may be formed of copper having a thickness of 0.002-0.02 mm. In addition, gold (Au) may be plated on the metal layer so as to prevent oxidation of the metal layer.

Advantageous Effects

A solderable electric contact terminal according to the present invention has the following advantages.

1. The electric contact terminal has good electrical conductivity and can be soldered because a metal layer is formed on its outer surface.
2. The electric contact terminal includes a polyimide film, an insulating silicon foam rubber, and an insulating silicon non-foam rubber coating layer; thus, their inherent performance can be maintained during soldering.
3. The insulating silicon non-foam rubber coating layer is not again melt because it is formed by vulcanizing a liquid silicon rubber. Therefore, the electric contact terminal can maintain a reliable adhesion.

4. The electric contact terminal can be pressed by low pressure because the insulating foam rubber is formed of foams.

5. A manufacturing cost can be reduced because the polyimide film having the metal layer on its outer surface uses a single-sided FPCB.

6. The electric contact terminal can be cut into a desired length using a knife. Therefore, various sizes of the electric contact terminal can be economically provided.

7. The metal layer has less influence on an ITO-coated glass substrate because its hardness is lowered by the insulating foam rubber.

8. A surface of the electric contact terminal facing the object is so flat that a vacuum can be easily formed during surface mounting.

9. The manufacturing process is economical because the insulating foam rubber and the polyimide film having the metal layer on its outer surface are adhered by a liquid silicon rubber.

10. The flexible electric contact terminal can be provided by forming the metal layer of the polyimide film using an etching process.

BEST MODE

Hereinafter, embodiments of the present invention will be described in detail with reference to the accompanying drawings.

Figure 1:
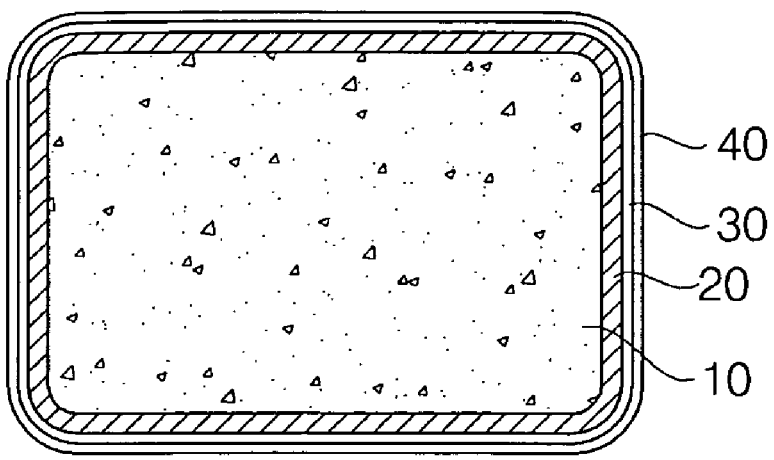
FIG. 1 is a sectional view of an electric contact terminal (100) according to an embodiment of the present invention.
Figure 2:
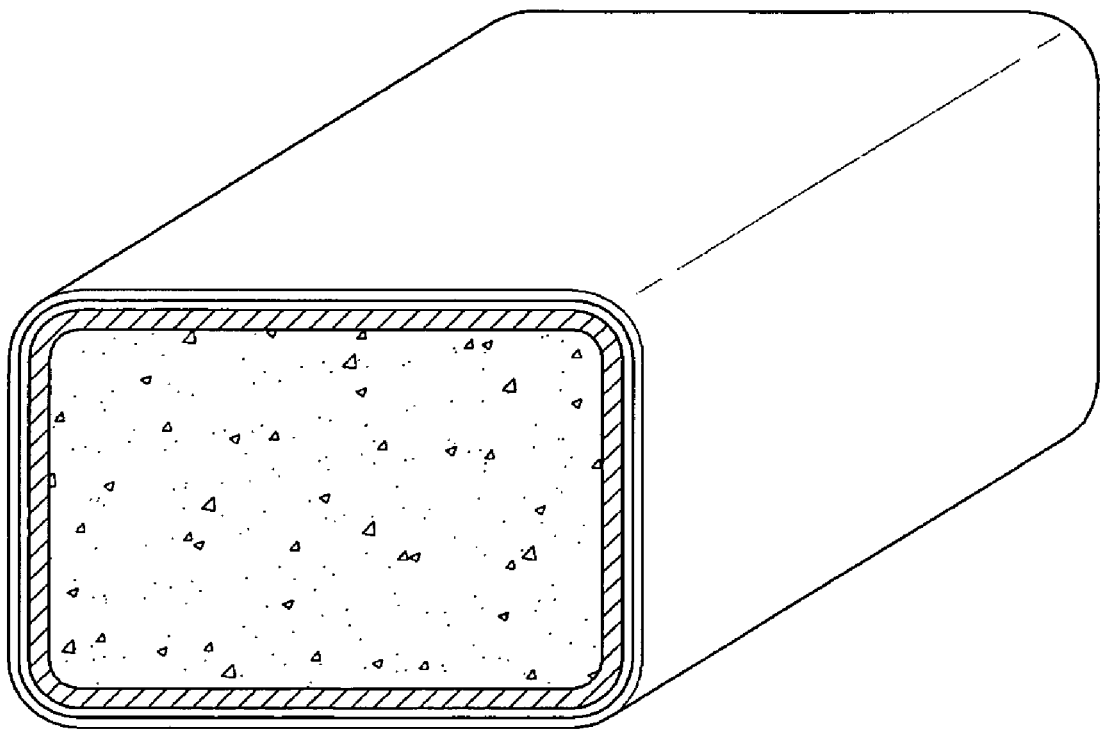
FIG. 2 is a perspective view of the electric contact terminal (100) shown in FIG. 1.

FIG. 1 is a sectional view of an electric contact terminal 100 according to an embodiment of the present invention, and FIG. 2 is a perspective view of the electric contact terminal 100 shown in FIG. 1.

Referring to FIGS. 1 and 2, an insulating foam rubber 10 has a polygonal section (e.g., a rectangular section). An insulating non-foam rubber coating layer 20 is disposed between the insulating foam rubber 10 and a heat resistant polymer film 30 to reliably attach the insulating foam rubber 10 to the heat resistant polymer film 30. According to the present invention, a metal layer 40 is integrally formed on an outer surface of the heat resistant polymer film 30. The heat resistant polymer film 30 may be a single-sided flexible printed circuit board (FPCB). Here, the insulating foam rubber 10 is used to function as an elastic core, therefore an insulating non-foam rubber having a tube shape may be used instead of insulating foam rubber 10.

Preferably, a metal etching process is performed to remove a portion of the metal layer 40 formed on the outer surface of the heat resistant polymer film 30 so as to improve the flexibility of the electric contact terminal 100.

A method for fabricating the electric contact terminal 100 of FIG. 1 will be described below.

On the surface of the heat resistant polymer film 30 where the metal layer 40 is formed, a liquid silicon rubber vulcanized by moisture is coated to a thickness of 0.03-0.5 mm to form a coating layer. A vulcanized roll-type insulating foam rubber 10 is placed on the coating layer and enclosed using a jig with a predetermined shape.

The adhesive force between the insulating foam rubber 10 and the heat resistant polymer film 30 is lowered when the thickness of the coating layer of the liquid silicon rubber is too small. On the contrary, when the thickness of the coating layer is too large, it takes a long time to vulcanize the liquid silicon rubber. In addition, when the coating layer is formed of the liquid silicon rubber vulcanized by moisture, it is preferable that the coating layer is formed under nitrogen atmosphere or vacuum.

Then, the heat resistant polymer film 30 enclosing the insulating foam rubber 10 is placed on a die having a size similar to that of the insulating foam rubber 10 and the liquid silicon rubber coating layer interposed therebetween is vulcanized. At this point, while the liquid silicon rubber layer is vulcanized and changed into an insulating non-foam rubber coating layer 20. The insulating non-foam rubber coating layer 20 adheres the insulating foam rubber 10 to the heat tolerant polymer film 30. That is, after the liquid silicon coating layer is vulcanized in the inside of the die, it is changed into the insulating non-foam rubber coating layer 20 that serves as an adhesive to adhere the insulating foam rubber 10 to the heat resistant polymer film 30 and has a resilience.

Once the liquid silicon rubber is vulcanized, it is not again melt by heat. Therefore, the original adhesion performance can be maintained when the electric contact terminal 100 is soldered. A working speed can be enhanced by maintaining a die temperature at 60° C. so as to increase a vulcanization speed of the liquid silicon rubber disposed inside the die and providing a large amount of moisture through holes formed in a predetermined portion of the die. A preferable humidity is more than 60% relative humidity.

Long products may be creased because the electric contact terminal 100 is fabricated using the heat tolerant polymer film 30 having the metal layer 40 formed on the outer surface. Therefore, the electric contact terminal 100 is fabricated with a length of less than 1 m and then is cut into a required length ranging from 3 mm to 30 mm. Hence, the vulcanization time can be reduced by cutting the electric contact terminal 100 into the required length before the liquid silicon rubber is completely vulcanized. In addition, the working time can be reduced by using a liquid silicon rubber vulcanized by heat, instead of the liquid silicon rubber vulcanized by moisture.

Because the outer surface of the electric contact terminal 100 is formed of the metal layer 40, the electric contact terminal 100 has good electrical conductivity of less than 0.01Ω and is well soldered. In this embodiment, because the heat resistant polymer film 30 is formed of polyimide and the insulating foam rubber 10 and the insulating non-foam rubber coating layer 20 are formed of silicon rubber, their original performance can be maintained. In addition, the insulating foam rubber 10 and the insulating non-foam rubber coating layer 20 have good elastic resilience because they are formed of silicon rubber. In particular, the insulating foam rubber 10 can be pressed by low pressure because it is foamed. Moreover, the electric contact terminal 100 has an accurate dimension because it is fabricated in such a state that it is fixed by the die.

Figure 3:
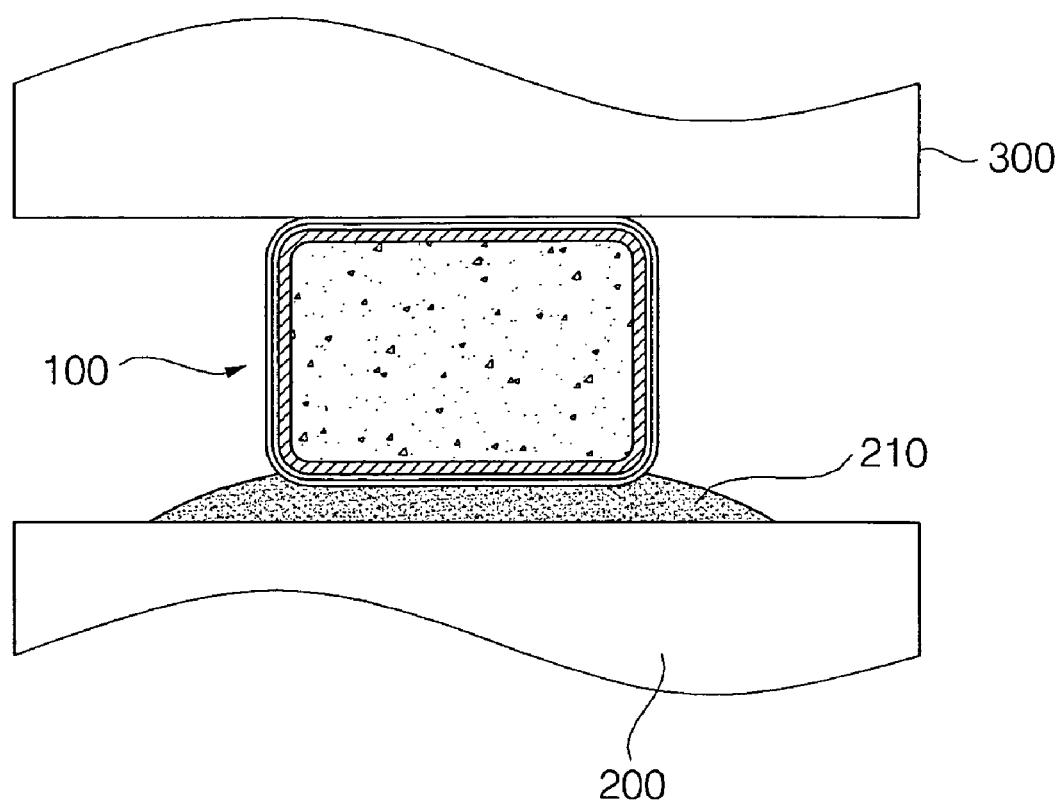
FIG. 3 is a sectional view illustrating an actual application of the electric contact terminal (100) according to the present invention.

FIG. 3 is a sectional view illustrating an actual application of the electric contact terminal 100 according to the present invention.

Inner surface of the electric contact terminal 100 is fixed to a PCB 200 by a reflow soldering of a solder 200 and the other side of the electric contact terminal 100 is electrically and mechanically contacted to a conductive object 300, thereby forming an electrical conduction path in the following order: the conductive object 300, the metal layer 40 formed on the outer surface, the solder 210, and the PCB 200. Preferably, a portion opposite to the soldered portion of the electric contact terminal 100 is so flat that it can provide a vacuum for surface mounting.

Figure 4:
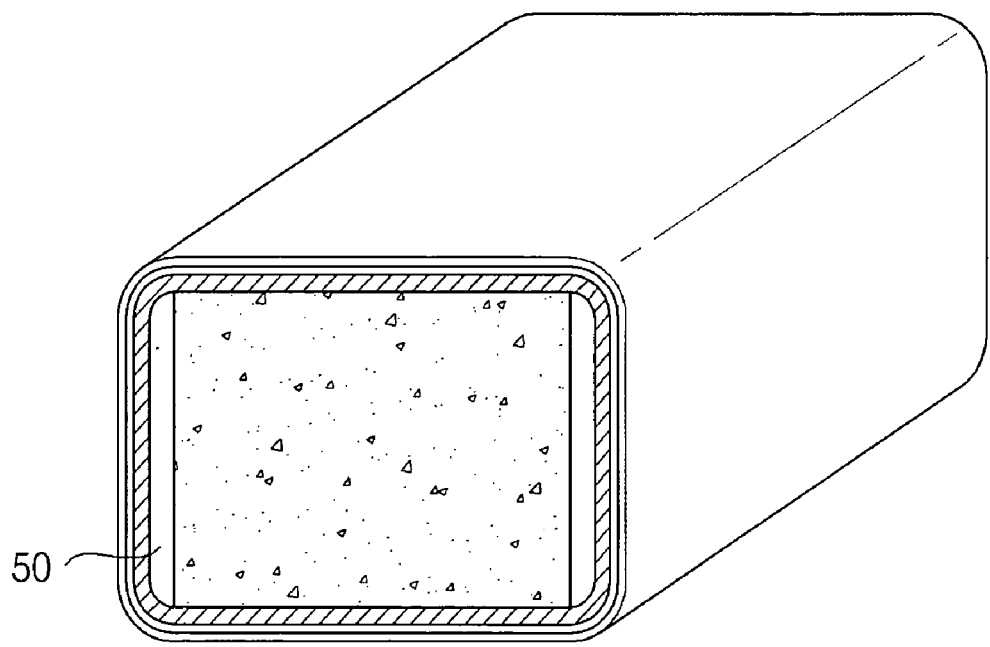
FIG. 4 is a perspective view of an electric contact terminal (100) according to another embodiment of the present invention.

FIG. 4 is a perspective view of an electric contact terminal 100 according to another embodiment of the present invention. In a process of fabricating the electric contact terminal 100, a heat resistant polymer film 30 is prepared which is longer than an entire circumferential length of an insulating foam rubber 10 and has a metal layer 40 on its outer surface. The heat resistant polymer film 30 is put into a die, a width of which is widened by the increased length.

In this case, an insulating non-foam rubber coating layer 20 is formed on an entire surface of the heat resistant polymer film 30 having the metal layer 40 on the outer surface. However, an empty space 50 that does not contact the insulating foam rubber 10 is formed at the increased portion. That is, a liquid silicon rubber must be fixed for more than a predetermined time so as to have an adhesion performance due to the vulcanization. The empty space 50 can be formed using this property. The empty space 50 can prevent the crease of the heat resistant polymer film 30 corresponding to the empty space 50 when the electric contact terminal 100 is pressed by an object. In addition, a width of the electric contact terminal 100 can be adjusted by the empty space 50. Therefore, the electric contact terminal 100 having various widths can be fabricated using the insulating foam rubber 10 having one width. As this result, the method of the present invention is very efficient.

Figure 5:
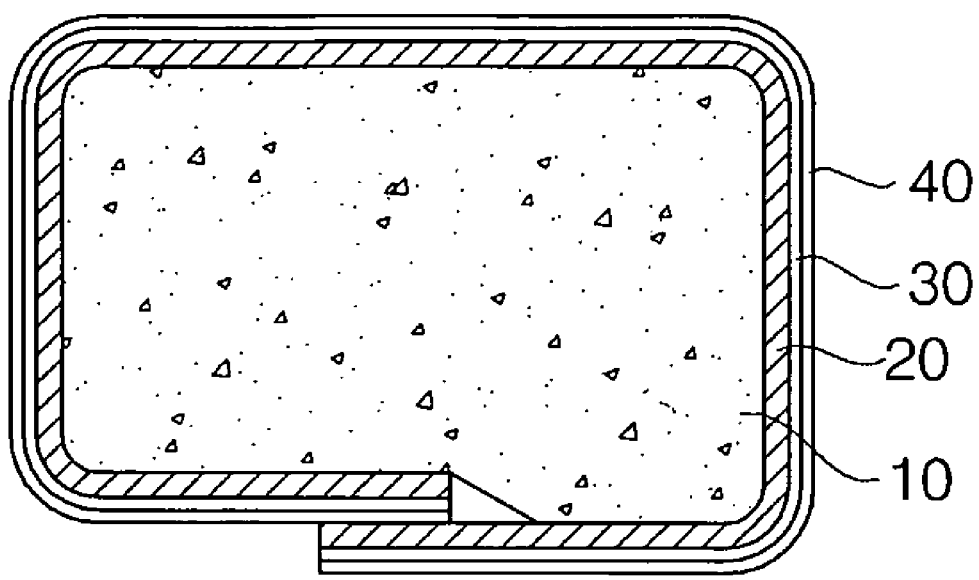
FIG. 5 is a sectional view of an electric contact terminal (100) according to a further embodiment of the present invention.

FIG. 5 is a sectional view of an electric contact terminal 100 according to a further embodiment of the present invention. An insulating non-foam rubber coating layer 20 and a heat resistant polymer film 30 having a metal layer on its outer surface are overlapped and adhered to a predetermined portion of inner surface of an insulating non-foam rubber coating layer 20. This is caused by dimension tolerance of the internal insulating foam rubber 10.

Figure 6:
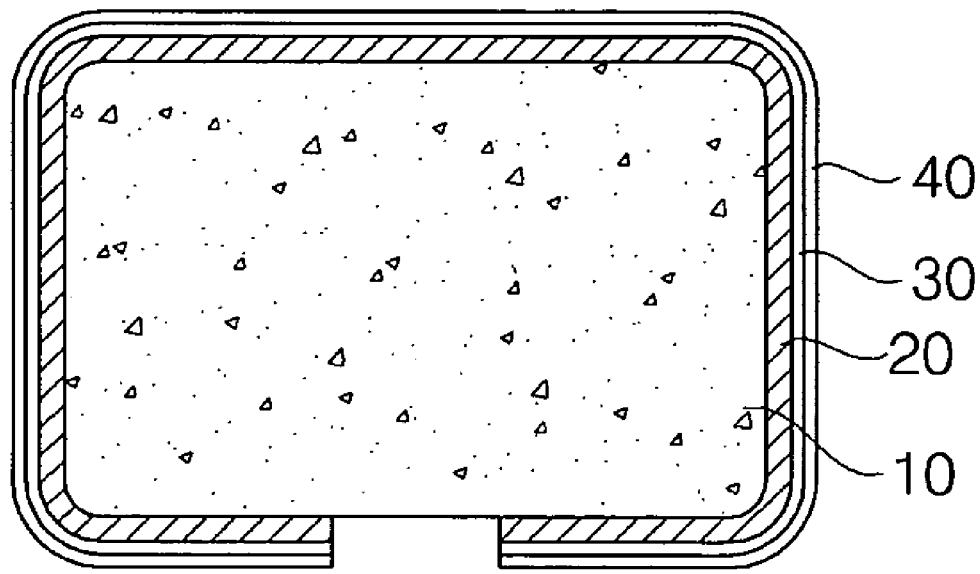
FIG. 6 is a sectional view of an electric contact terminal (100) according to a further another embodiment of the present invention.

FIG. 6 is a sectional view of an electric contact terminal 100 according to a further another embodiment of the present invention. An insulating non-foam rubber coating layer 20 is not formed in a predetermined portion of inner surface of the insulating foam rubber 10, and a heat resistant polymer film 30 having a metal layer 40 on its outer surface is not adhered thereto. This may be caused by dimension tolerance of the internal insulating foam rubber 10. While the present invention has been described in detail, it should be understood that various changes, substitutions and alterations can be made hereto without departing from the spirit and scope of the invention as defined by the appended claims.

The invention claimed is:

1. A solderable electric contact terminal comprising;
    an insulating foam rubber having a predetermined volume;
    an insulating non-foam rubber coating layer adhered to the insulating foam rubber such that the insulating non-foam rubber encloses the insulating foam rubber; and
    a heat resistant polymer film having inner surface adhered to the insulating non-foam rubber coating layer such that the heat resistant polymer film encloses the insulating non-foam rubber coating layer, and outer surface on which a metal layer is integrally formed.

2. The solderable electric contact terminal of claim 1, wherein the insulating foam rubber is a silicon rubber.

3. The solderable electric contact terminal of claim 1, wherein the insulating non-foam rubber coating layer is formed by vulcanization of a liquid silicon rubber interposed between the insulating foam rubber and the heat resistant polymer film.

4. The solderable electric contact terminal of claim 1, wherein the heat resistant polymer film having the metal layer on the outer surface is a single-sided flexible printed circuit board (FPCB).

5. The solderable electric contact terminal of claim 1, wherein the heat resistant polymer film is formed of polyimide.

6. The solderable electric contact terminal of claim 1, wherein the metal layer is soldered by a reflow soldering for surface mounting.

7. A solderable electric contact terminal comprising;
    an insulating elastic core consisting of an insulating foam rubber or an insulating non-foam rubber having a tube shape;
    an insulating non-foam rubber coating layer adhered to the insulating elastic core such that the insulating non-foam rubber encloses the insulating elastic core; and
    a heat resistant polymer film having inner surface adhered to the insulating non-foam rubber coating layer such that the heat resistant polymer film encloses the insulating non-foam rubber coating layer, and outer surface on which a metal layer is integrally formed.

8. The solderable electric contact terminal of claim 7, wherein the heat resistant polymer film is formed of polyimide.

* * * * *